United States Patent [19]

Ogawa

[11] Patent Number: 4,945,028
[45] Date of Patent: Jul. 31, 1990

[54] METHOD FOR FORMATION OF PATTERNS USING HIGH ENERGY BEAM

[75] Inventor: Kazufumi Ogawa, Hirakata, Japan

[73] Assignee: Matsushita Electric Industrial Co., Ltd., Osaka, Japan

[21] Appl. No.: 341,257

[22] Filed: Apr. 20, 1989

Related U.S. Application Data

[63] Continuation of Ser. No. 61,541, Jun. 12, 1987, abandoned.

[30] Foreign Application Priority Data

Jun. 12, 1986 [JP]  Japan ................................ 61-136512
Oct. 14, 1986 [JP]  Japan ................................ 61-243401

[51] Int. Cl.$^5$ ................................................ G03C 5/00
[52] U.S. Cl. ................................... 430/296; 430/323; 430/325
[58] Field of Search ................... 430/96, 314, 323, 325

[56] References Cited

U.S. PATENT DOCUMENTS

| | | | |
|---|---|---|---|
| 4,539,061 | 9/1985 | Sagiv | 430/141 |
| 4,552,833 | 11/1985 | Ito et al. | 430/313 |
| 4,613,398 | 9/1986 | Chiong et al. | 427/41 |
| 4,618,561 | 10/1986 | Munakata et al. | 430/156 |

FOREIGN PATENT DOCUMENTS 2154330  9/1985  United Kingdom ................ 430/184

Primary Examiner—Jack P. Brammer
Attorney, Agent, or Firm—Wenderoth, Lind & Ponack

[57] ABSTRACT

Disclosed is a method for formation of a resist pattern used in the photo lithography steps for preparing semiconductor devices and more particularly, a method for formation of a superfine resist pattern which comprises selectively exposing a resist surface of a photosensitive high molecular film to light to modify the exposed area to a hydrophilic property, chemically adsorbing a Si-containing reagent selectively to the modified area and then subjecting to $O_2$ RIE using the Si-adsorbed film as a mask. The method is also characterized by enabling to formation of a finer pattern formation using a monomolecular film or monomolecular built-up film formed by the LB method or the chemical adsorption method in place of the resist described above.

10 Claims, 6 Drawing Sheets

METHOD FOR FORMATION OF PATTERNS USING HIGH ENERGY BEAM

This application is a continuation of now abandoned application, Ser. No. 07/061,541 filed on June 12, 1987.

FIELD OF THE INVENTION

The present invention relates to a method for formation of patterns which can be utilized for production of semi-conductor elements, printing plates, etc. and more particularly, to a method for formation of patterns which comprises selectively performing pattern-like film formation using chemical reactions on optional base plates.

BACKGROUND OF THE INVENTION

Brief Description of the Prior Art

To produce resist patterns or resin patterns as master plates upon production of semi-conductor elements or production of printing plates, there has been hitherto used generally a method which comprises forming a resin film capable of being polymerized or decomposed upon exposure to light on a base plate, exposing the resin film pattern-wise and then developing to form optional patterns. However, the demand for making these resist or resin patterns more minute has been increasing because of requirements for high density of semi-conductor elements and high quality of printed matters.

Particularly in the production of VLSI, it is necessary to produce resist patterns of a submicron level with good accuracy.

In such a case, although it is also greatly affected by physical properties of resist resins per se, generally speaking, a thickness of resist to be coated must be made thin as one wishes minute patterns, namely, in order to increase a resolving power. On the other hand, to make patterns of a submicron level, wet etching is inapplicable but dry etching techniques such as ion etching, plasma etching, sputter etching, etc. must be used. In order to improve dry etching resistance of resist patterns, however, a thickness of resist coated must be generally thickened although it depends on resist materials.

For satisfying the two requirements described above, it may thus be sufficient to develop photoresists having a good resolving power even in a thick coating or photoresists having good resistance to dry etching resolving power; however such materials have not been found so far.

SUMMARY OF THE INVENTION

The present invention aims at providing a method for forming resin patterns which eliminate the defects in the prior art and have a high resolving power and excellent resistance to etching.

The present invention is characterized by forming on a base plate a monomolecular film or a monomolecular built-up film containing a sensitive group example for forming a hydrophilic group example through chemical reactions by means of energy beams (electron beams, ion beams, light, X rays, etc.), exposing the film to the energy beams pattern-wise to render a part of the aforesaid sensitive group hydrophilic selectively and then pattern-wise forming the monomolecular film or monomolecular built-up film selectively depending upon the presence or absence of the hydrophilic group.

Further as a means for forming the monomolecular film or monomolecular built-up film, by built-up formation of the monomolecular film using the Langmuir-Blodgett method or the chemical adsorption method so as to make the energy beam-sensitive groups expose in line on the surface of the base plate, the present invention has enabled improving the sensitivity and forming ultrafine patterns.

The present invention is also characterized by forming the aforesaid patterns on a base plate via other organic thin films and then removing a part of the organic thin film beneath the patterns by etching using the above-described patterns as a mask, whereby the patterns are transferred onto the organic thin film and provided for use.

As materials used for forming the patterns which can be used in the present invention, there are those containing sensitive group having a hydrophilic group or a trichlorosilane group at one end of linear hydrocarbons and a sensitive group for causing a chemical reaction by energy beams to form a hydrophilic group on the other end.

Examples of the sensitive group include a naphthoquinonediazide group and a benzoquinone-diazide group.

The method of forming patterns in the present invention also comprises forming on an optional base plate a sensitive thin film containing a sensitive group therein which causes chemical reactions upon exposure to energy beams, pattern-wise exposing the sensitive thin film to energy beams to render the sensitive group hydrophilic or hydrophobic, then chemically adsorbing a chemical substance containing silicon selectively to the area which is not rendered hydrophilic or hydrophobic and further performing dry etching in an oxygen-containing gas. As the chemical substance described above, linear siloxane having bound chlorine to at least one end thereof is used.

Furthermore, the present invention comprises, after completion of the binding reaction, performing a step of substituting a hydroxy group for the chlorine at one end of the remaining siloxane molecule and a step of further binding the linear siloxane molecule having bound chlorines at both ends thereof to the aforesaid hydroxy group at least once.

The present invention further comprises forming a sensitive thin film on an optional base plate via an organic thin film, selectively binding a siloxane molecule thereto and then treating with oxygen plasma thereby to transfer patterns by the siloxane molecule onto the organic thin film.

The present invention is constructed as described above and enables formation of ultrafine patterns.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 1 through 9 are drawings for explaining an example of the method for formation of patterns according to the present invention, wherein FIGS. 1, 3, 5 and 8 are cross-sectional view of a semi-conductor base plate; FIGS. 2, 4, 6, 7 and 9 are enlarged views main area B in FIGS. 1, 3, 5 and 8, respectively, on a molecular level.

DETAILED DESCRIPTION OF THE INVENTION

[Example 1]

Figure 1:
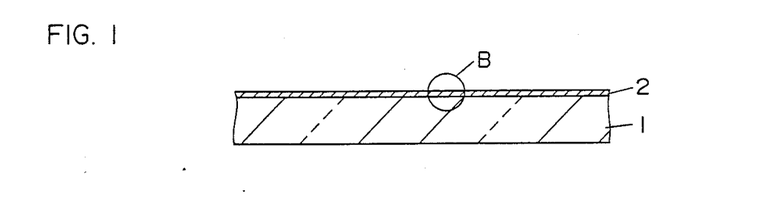

The first example of the method for formation of patterns in accordance with the present invention will be described below, referring to FIGS. 1 through 9. Monomolecular film 2 is formed on Si base plate 1 on which, for example, $SiO_2$ is formed, by the Langmuir-Blodgett (LB) method or the chemical adsorption method (FIG. 1). In this case, as reagent 3 for forming the monomolecular film by the Langmuir-Broject method, there is used a material represented by formula:

wherein n is an integer of 14 to 24;

X is a light-sensitive group 4 capable of causing a chemical reaction upon exposure to energy beams (light) such as:

etc. to form a hydrophilic group;

and Y is hydrophilic group 5 such as —COOH, —NH$_4^+$, etc.

Further as a reagent for forming the monomoleculr film by the chemical adsorption method, there is used a material represented by formula:

wherein n is an integer of 14 to 24;

X is a sensitive group 4 capable of causing a chemical reaction upon exposure to energy beams (light) such as:

etc. to form a hydrophilic group;

and Y is sensitive group 5' capable of causing hydrolysis on the surface of a base plate such as —SiCl$_3$, —SiHCl$_2$, SiH$_2$Cl, etc.

Figure 2:
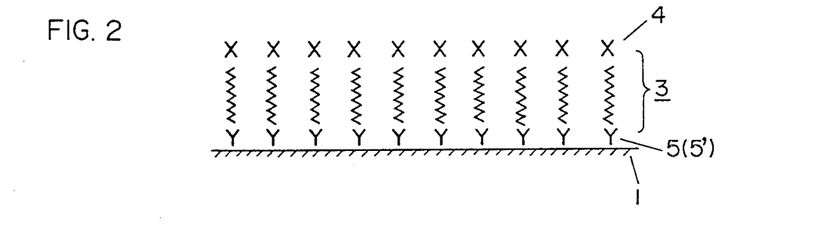

In case that the monomolecular film is formed using as LB reagent 3, for example, by the LB method, $SiO_2$ is formed on the Si base plate and thus, the monomolecular film shown in FIG. 2 can be formed on the base plate.

In FIG. 2, X represents a light-sensitive group:

and Y represents a hydrophilic group —COOH.

Figure 3:
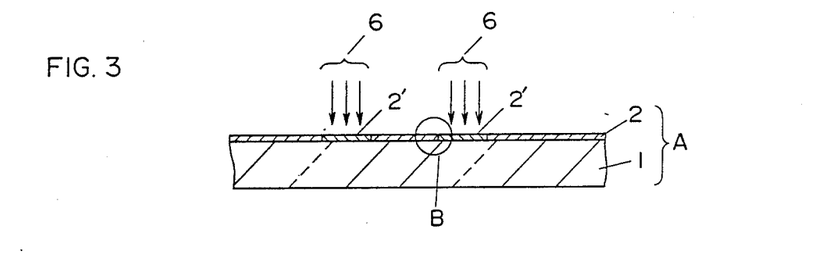
Figure 4:
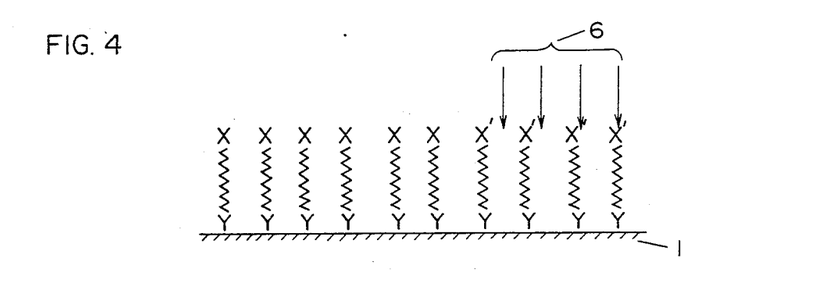

Then, energy beam, for example, light 6 having 435 nm is pattern-wise irradiated so that the sensitive group at the area which was exposed to light, for example, a naphthoquinone-diazide group (shown by sensitive group X in FIGS. 3 and 4) causes the reaction:

to convert into a hydrophilic indenecarboxylic acid group (X'). Namely, it is possible to render the surface of the monomolecular film hydrophilic (X') only at the selectively exposed area.

Figure 5:
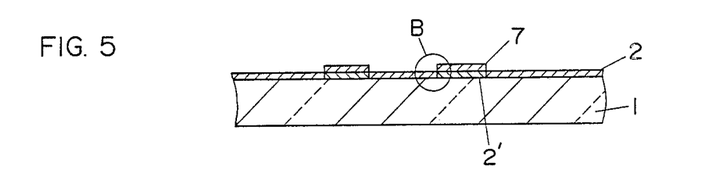
Figure 6:
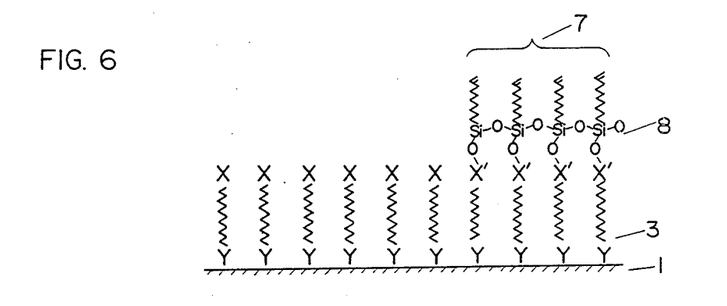

Next, chemical adsorption is performed using a silane surface active agent or the monomolecular film is built-up using the LB reagent, on base plate A on which monomolecular film 2' rendered pattern-wise hydrophilic is formed, whereby monomolecular film pattern 7 is formed in response to the pattern rendered hydrophilic (FIG. 5). The monomolecular film pattern 7 of:

is formed by selectively performing chemical adsorption of the —COOH group 4' of indenecarboxylic acid X' on the surface of the base plate using, for example, CH$_2$=CH—(CH$_2$)$_n$—SiCl$_3$ (wherein n is an integer of preferably 10 to 20 and $CH_2=CH-$ may also be $CH\equiv CH-$). The system is then immersed in, for example, a solution of 80% n-hexane, 12% carbon tetrachloride or 8% chloroform dissolved in a concentration of $2.0\times10^{-3}$ to $5.0\times10^{-2}$ Mol/l to form binding 8 of:

on the $SiO_2$ (FIG. 6, F).

Figure 7:
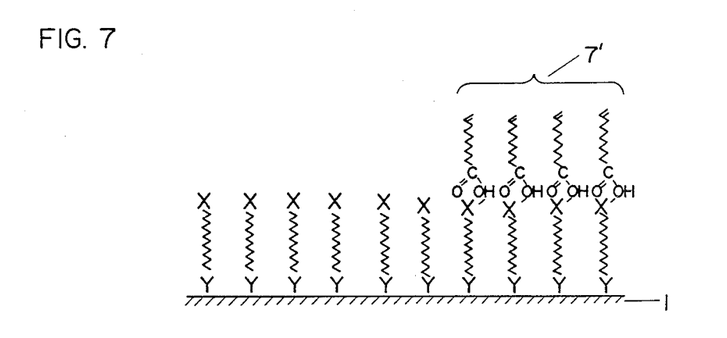

On the other hand, in that ω-tricosenoic acid ($CH_2=CH-(CH_2)_{2}-COOH$) or ω-tricosinoic acid ($CH\equiv C-(CH_2)_{20}-COOH$), etc. is built-up, the hydrophilic groups of these reagents, i.e., the —COOH group side makes line on the surface of X' to form selective built-up pattern 7' (FIG. 7).

Figure 8:
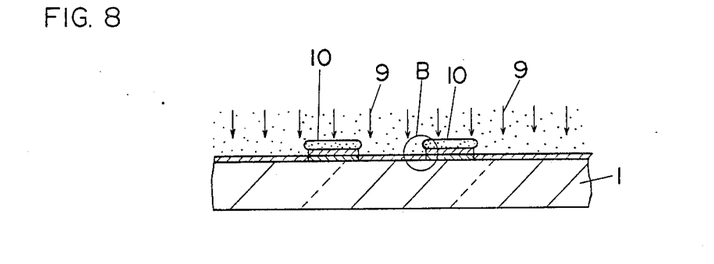
Figure 9:
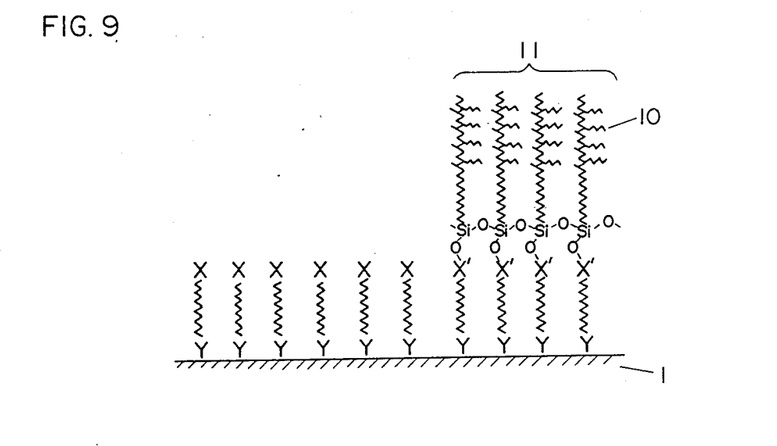

Further in the case that the thickness of the pattern is thickened, light is previously irradiated over the entire surface to change and inactivate the remaining X to X'; thereafter, the base plate is transferred to polymerizable monomer 7, for example, methyl methacrylate monomer in steam of approximately 1 to 3 torrs (other polymerizable monomers can be trimethylvinylsilane, tributylvinylsilane, diallylmethylphenylsilane, styrene, tetrafluoroethylene, acrylonitrile, methacrylic acid, divinylbenzene, vinyltoluene, maleic amide, etc.) and the entire surface is again exposed to energy beams (far ultraviolet rays) 9 for a short period of time to activate the sensitive group such as a vinyl group ($CH_2=CH-$), etc., thereby subjecting the monomer to addition polymerization 10 pattern-wise. At this step thin film pattern 11 obtained by polymerizing the aforesaid monomer on monomolecular film pattern 7 or 7' grows and is formed.

It is clear that the same effect can be obtained even though the monomer is introduced into a reaction room after the entire surface is previously exposed to far ultraviolet rays 9.

It is advantageous that when a Si-containing monomer such as trimethylvinylsilane, etc. is used as the polymerizable monomer, Si is contained in the polymerized pattern so that $SiO_2$ is formed to $O_2$ plasma and therefore, even though the thickness of the polymerized film is not so thickened, resistance to $O_2$ plasma etching can be ensured sufficiently to give a high resolving power. On the other hand, in case that the pattern is transferred onto photoresist, the thickness of the photoresist can be sufficiently thickened. Thus, this system can be utilized as an ultrafine resist pattern having sufficient etching resistance even to dry etching (for example, reactive sputter etching using $CF_4$ for etching $SiO_2$ or Si) generally used at steps for production of VLSI.

In the two examples described above, the method of adsorbing and reacting a silicone surface active agent as the sensitive thin film was shown; however, it is also possible to form the sensitive thin film according to the Langmuir-Blodgett method using reagents having balanced hydrophilic and hydrophobic properties such as reagents in which —Cl has been previously substituted with —OH ($CH_2=CH-(CH_2)_n-Si(OH)_3$, etc.) or ω-tricosenoic acid ($CH_2=CH-(CH_2)_{20}-COOH$), ω-heptadecenoic acid ($CH_2=CH-(CH_2)_{14}-COOH$), acetylene derivatives ($CH\equiv C-(CH_2)_n-COOH$), etc.

In the aforesaid examples using the chemical adsorption method, the interface reaction between $-SiCl_3$ and —OH was shown but the method is not considered to be limited to this reaction as long as substances show a similar reaction mechanism.

[Example 2]

The second embodiment of the present invention will be described with reference to FIG. 10.

FIG. 10 shows the second embodiment. In A of this figure, energy-sensitive thin film 102 which produces a hydrophilic group upon exposure to energy beams such as light, etc., for example, a thin film of novolak type positive resist AZ 1400 or AZ 2400 manufactured by Shiply Co., Ltd., poly-formyloxystyrene, poly-chloromethylstyrene, poly-t-butoxycarbonyloxystyrene onium salt, poly-t-butylmethacrylate onium salt, etc., is coated and formed on Si base plate 101 on which $SiO_2$ is formed. As shown in FIG. 11b, the system is pattern-wise exposed to energy beams. Then, the exposed area of the energy-sensitive thin film produces hydrophilic group 105 such as —OH group, etc. on the flat surface thereof as shown in FIG. 10C. In case that exposure to ultraviolet rays is performed using, for example, AZ 1400 as the energy-sensitive thin film, the naphthoquinone-diazide derivative contained in the interior thereof causes the reaction shown by equation (1) to bring about hydrophilic property.

(1)

Alternatively, in the case of using poly-formyloxystyrene, the reaction as shown in equation (2) is caused to render selectively hydrophilic.

(2)

Figure 10A:
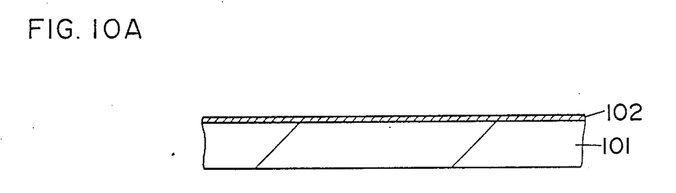
FIG. 10 is a cross-sectional view of steps showing a second example of the present invention and FIG. 11 is a cross-sectional view of steps showing a third example of the present invention.
Figure 10B:
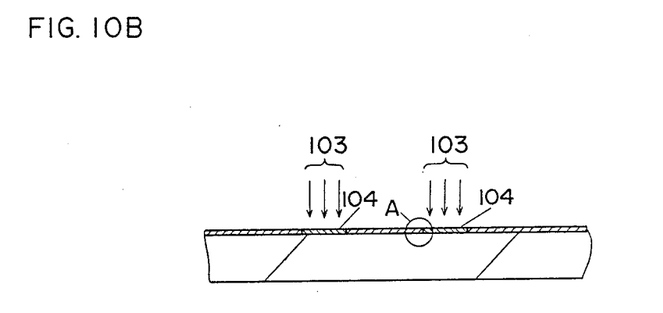
Figure 10C:
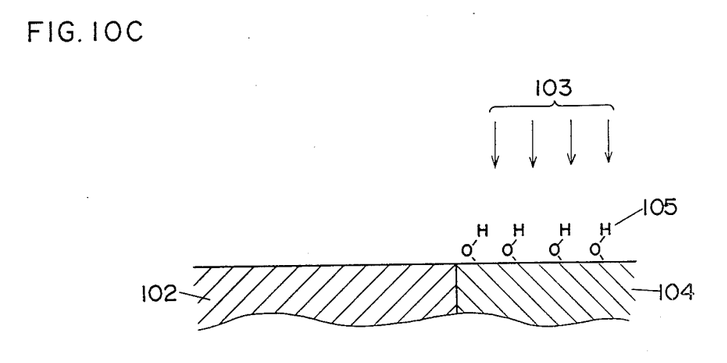
Figure 10D:
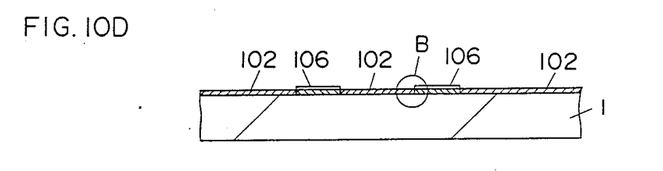
Figure 10E:
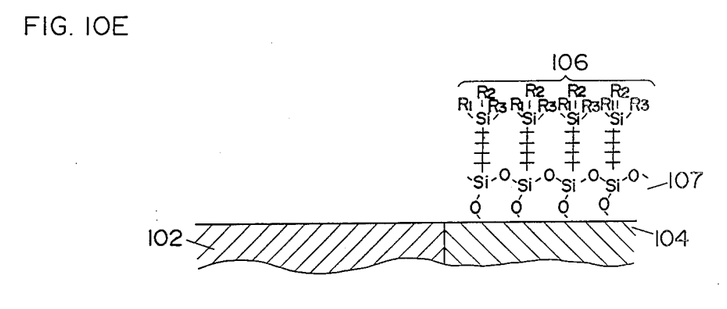
Figure 10F:
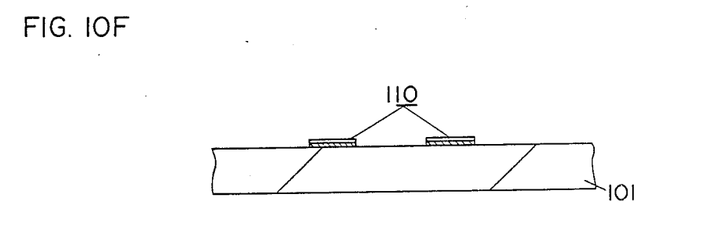

Next, the system is immersed in a non-aqueous solvent containing a linear siloxane having bound chlorine to at least one end thereof (hereafter referred to siloxane molecule), for example:

wherein n is an integer and $R_1$ to $R_6$ represent an alkyl group, etc., to form monomolecular film 6 of the siloxane molecule selectively at the exposed area 104 of the energy-sensitive thin film through the chemical adsorption reaction (FIG. 10D). For example, after immersing in a solution of the siloxane molecule in 80% n-hexane, 12% carbon tetrachloride and 8% chloroform in a concentration of $2.0 \times 10^{-3}$ to $5.0 \times 10^{-2}$ Mol/l in a definite time period, bond 107 of:

is formed on the surface at the exposed area 104. Namely, as shown in FIG. 10E, the monomolecular film containing Si is selectively formed only at the exposed area 104.

Lastly, at the area in which the Si-containing monomolecular film is formed by treatment in a plasma atmosphere (which may also be RIE or ECR) containing $O_2$, $SiO_2$ is formed by the $O_2$ plasma but no etching proceeds; on the other hand, at the area in which the monomolecular film is not formed, $CO_2$ or $H_2O$ is formed and the thin film is removed, whereby ultrafine resist pattern 110 can be formed.

In the example described above, the case of using the thin film producing a hydrophilic group by energy beams was shown but it is also possible to cause a similar reaction even when a thin film capable of producing a hydrophobic group conversely is used; in this case, the thin film is removed at the exposed area as a matter of course and a so-called positive pattern is formed.

[Example 3]

In a third embodiment, the method shown in Example 2 is carried out on a base plate on which an organic thin film is formed and the pattern formed in Example 2 is transferred onto the organic thin film.

Figure 11A:
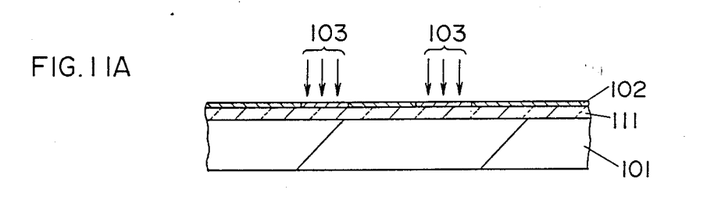
Figure 11B:
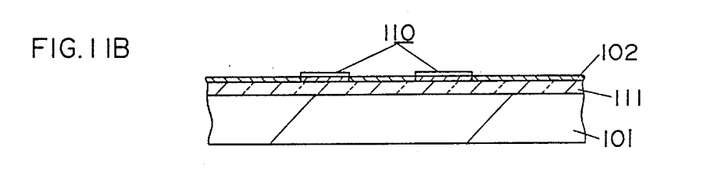
Figure 11C:
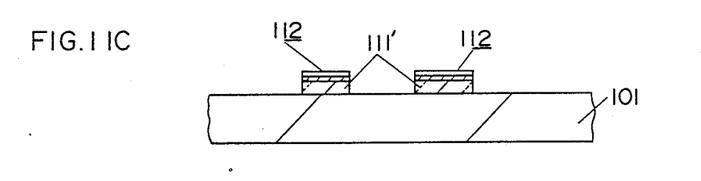

The embodiment is shown in FIG. 11. As shown in the figure A, the organic thin film, for example, gum-derived resist 111 is coated onto base plate 101 and energy-sensitive thin film 102 is further coated onto the surface of resist 111 in a manner similar to Example 2. Next, the step of exposing to light is performed in a manner similar to Example 2 to form Si-containing pattern 110 covered with the Si-containing siloxane molecule, as shown in FIG. 11D. Then, the pattern covered with the siloxane molecule is subjected to $O_2$ plasma treatment as shown in FIG. 11C, whereby resist 111 can be selectively etched and pattern 112 can be transferred onto the gum-derived resist. In this case, the gum-derived resist is used as the organic thin film but any substance can be used as long as it can be etched by $O_2$ plasma.

In the above examples, the interface reaction between —$SiCl_3$ and —OH is shown as an example but the method is not considered to be limited to this reaction as long as substances take a similar reaction mechanism. Therefore, the method of the present invention is greatly effective for improving the photo lithography steps upon formation of ultrafine patterns, particularly in the production of VLSI.

As has been stated hereinabove, according to the method of the present invention, ultrafine patterns can be formed because the energy beam-sensitive thin film upon the pattern formation is formed as a monomolecular film or several layers of monomolecular built-up film. In addition, when a Si-containing monomer is used as the polymerizable monomer, a polymerized film pattern having high resistance to $O_2$ dry etching can be obtained.

Further the Langmuir-Blodgett method and the adsorption method used for forming the sensitive thin film proceeds at the interface with the surface of the base plate so that these methods are not greatly affected by a level difference of the base plate and accordingly, in the case of utilizing these methods in base plates having a great difference in level such as on VLSI elements, etc., the methods are very effective. As such, the method of the present invention is greatly effective for improving the photo lithography steps upon the production of ultrafine patterns, particularly upon the production of VLSI.

Furthermore, according to the method of the present invention, the energy beam-sensitive thin film upon the pattern formation can be formed extremely thin so that ultrafine pattern can be formed. Namely, pattern 110 containing Si can ensure sufficient etching resistance since $SiO_2$ is formed against $O_2$ plasma so that it is greatly advantageous for formation of ultrafine pattern of a sub-micron level. On the other hand, when the pattern can be transferred onto the organic thin film by dry etching, the thickness of the resist can be sufficiently thickened so that the system can be utilized as a ultrafine resist pattern having sufficient etching resistant also to dry etching (for example, ion etching or sputter etching) generally used for steps for preparing VLSI.

While specific embodiments of the invention have been illustrated and described herein, it is realized that other modifications and changes will occur to those skilled in the art. It is therefore to be understood that the appended claims are intended to cover all modifications and changes as falling within the true spirit and scope of the invention.

What is claimed is:

1. A pattern forming method comprising the steps of:
   preparing an energy-beam sensitive and hydrophobic film which comprises providing energy-beam sensitive molecules or polymers which contain energy-beam sensitive and hydrophobic groups which form hydrophilic groups when irradiated with said energy-beam, on the entire surface of a substrate;
   selectively changing portions of the surface of said hydrophobic film to hydrophilic portions in a pattern-wise manner by selectively irradiating said film with said energy-beam;
   selectively depositing an additional monomolecular film or an additional multi-monomolecular built-up film on said hydrophilic portions of the irradiated film by chemically adsorbing a silicion-containing reagent; and
   performing a dry etching process using said additional monomolecular film on said additional multi-molecular built up film as a mask to form a thin film pattern.

2. The method of claim 1, wherein said energy-beam sensitive and hydrophobic film is deposited by the chemical adsorption method.

3. The method of claim 1, wherein said energy-beam sensitive and hydrophobic film is deposited by the Langmuir-Blodgett method.

4. The method of claim 1, wherein said energy-beam sensitive molecules comprise a straight hydrocarbon chain, one end of which has chlorosilane groups and other end of which has an energy-beam sensitive and hydrophobic group which forms a hydrophilic group by chemical reaction upon irradiation with the energy-beam.

5. The method of claim 4, wherein said energy-beam sensitive and hydrophobic group which forms said hydrophilic group comprises a naphthoquinone-diazide or a benzoquinone-diazide group.

6. The method of claim 1, wherein said energy-beam sensitive molecules comprise a straight hydrocarbon chain, one end of which has hydrophilic groups and other end of which has an energy-beam sensitive and hydrophobic group which form a hydrophilic group by chemical reaction upon irradiation with the energy-beam.

7. The method of claim 6, wherein said energy-beam sensitive and hydrophobic group which forms said hydrophilic group comprises a naphthoquinone-diazide or a benzoquinone-diazide group.

8. The method of claim 1, wherein said energy-beam is light, X-rays, electron beams or ion beams.

9. The method of claim 1, wherein said step of depositing the additional monomolecular film is performed after the step of adding other sensitive groups to the surface of said irradiated film.

10. The method of claim 1, wherein molecules having a straight siloxane chain and chlorosilane are used for depositing the additional film selectively.

* * * * *